United States Patent
Javorka et al.

(10) Patent No.: US 8,536,009 B2
(45) Date of Patent: Sep. 17, 2013

(54) DIFFERENTIAL THRESHOLD VOLTAGE ADJUSTMENT IN PMOS TRANSISTORS BY DIFFERENTIAL FORMATION OF A CHANNEL SEMICONDUCTOR MATERIAL

(75) Inventors: Peter Javorka, Radeburg (DE); Maciej Wiatr, Dresden (DE); Stephan-Detlef Kronholz, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/197,239

(22) Filed: Aug. 3, 2011

(65) Prior Publication Data
US 2012/0153401 A1 Jun. 21, 2012

(30) Foreign Application Priority Data
Dec. 21, 2010 (DE) .................. 10 2010 063 781

(51) Int. Cl.
*H01L 21/8234* (2006.01)

(52) U.S. Cl.
USPC ............................ 438/275; 438/276; 257/392

(58) Field of Classification Search
CPC .......... H01L 21/8228; H01L 21/823412; H01L 21/8238; H01L 21/823807
USPC ............ 438/142, 197, 275, 276; 257/213, 257/288, 368, 392, E27.06, E21.63
See application file for complete search history.

(56) References Cited

U.S. PATENT DOCUMENTS

| | | | |
|---|---|---|---|
| 6,380,590 B1 * | 4/2002 | Yu ................................. | 257/350 |
| 6,413,824 B1 * | 7/2002 | Chatterjee et al. ............ | 438/275 |
| 2004/0041174 A1 * | 3/2004 | Okihara ........................ | 257/200 |
| 2010/0155855 A1 * | 6/2010 | Anderson et al. ............. | 257/392 |

OTHER PUBLICATIONS

Translation of Official Communication from German Patent Office for German Patent Application No. 10 2010 063 781.5 dated Jul. 6, 2011.

* cited by examiner

*Primary Examiner* — Khiem D Nguyen
(74) *Attorney, Agent, or Firm* — Williams, Morgan & Amerson, P.C.

(57) ABSTRACT

In sophisticated semiconductor devices, high-k metal gate electrode structures may be provided in an early manufacturing stage wherein the threshold voltage adjustment for P-channel transistors may be accomplished on the basis of a threshold voltage adjusting semiconductor alloy, such as a silicon/germanium alloy, for long channel devices, while short channel devices may be masked during the selective epitaxial growth of the silicon/germanium alloy. In some illustrative embodiments, the threshold voltage adjustment may be accomplished without any halo implantation processes for the P-channel transistors, while the threshold voltage may be tuned by halo implantations for the N-channel transistors.

19 Claims, 2 Drawing Sheets

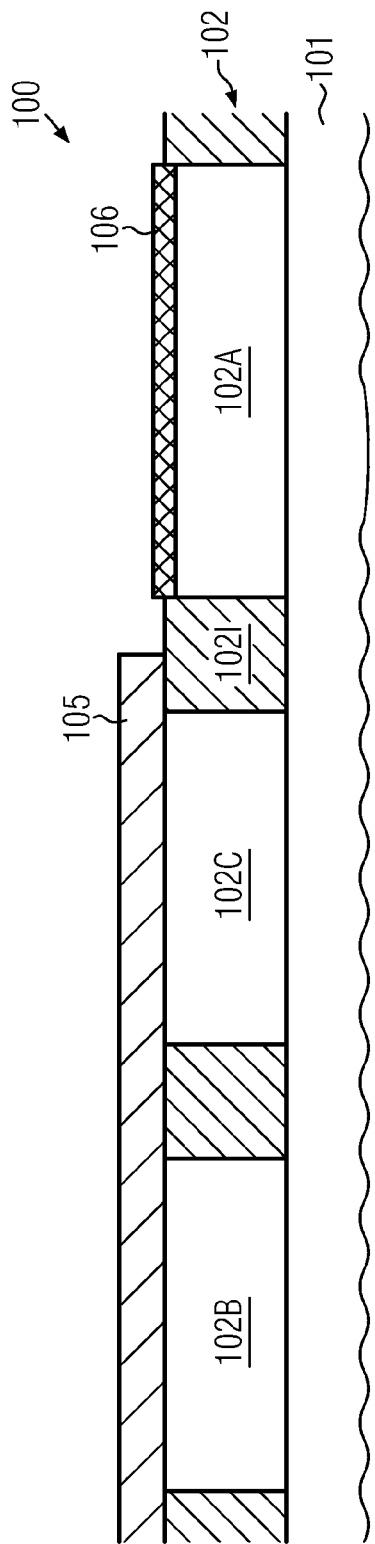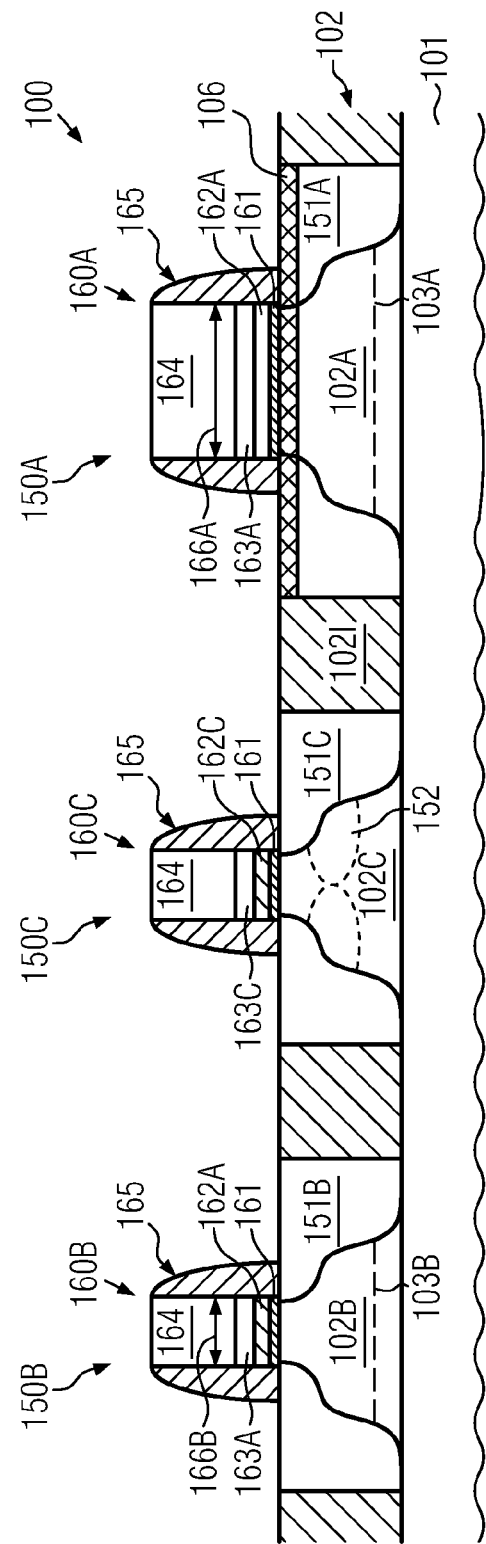

DIFFERENTIAL THRESHOLD VOLTAGE ADJUSTMENT IN PMOS TRANSISTORS BY DIFFERENTIAL FORMATION OF A CHANNEL SEMICONDUCTOR MATERIAL

BACKGROUND OF THE INVENTION

1. Field of the Invention

The present disclosure generally relates to integrated circuits, and, more particularly, to the highly sophisticated integrated circuits including transistor structures of different threshold voltages.

2. Description of the Related Art

The manufacturing process for integrated circuits continues to improve in several ways, driven by the ongoing efforts to scale down the feature sizes of the individual circuit elements. A key issue in developing integrated circuits of increased packing density and enhanced performance is the scaling of transistor elements, such as MOS transistor elements, to increase the number of transistor elements in order to enhance performance of modern CPUs and the like with respect to operating speed and functionality. One important aspect in manufacturing field effect transistors having reduced dimensions is the reduction of the length of the gate electrode that controls the formation of a conductive channel separating the source and drain regions of the transistor. The source and drain regions of the transistor element are conductive semiconductor regions including dopants of an inverse conductivity type compared to the dopants in the surrounding crystalline active region, which may also be referred to as a substrate or a well region.

Although the reduction of the gate length is necessary for obtaining smaller and faster transistor elements, it turns out, however, that a plurality of issues are additionally involved to maintain proper transistor performance for a reduced gate length. For example, so-called short channel effects may occur for highly scaled transistor elements, resulting in a reduced controllability of the channel region, which may cause increased leakage currents and generally degraded transistor performance. One challenging task in this respect is, therefore, the provision of appropriately designed junction regions in the form of shallow junctions at least at the area in the vicinity of the channel region, i.e., source and drain extension regions, which nevertheless exhibit a moderately high conductivity so as to maintain the resistivity in conducting charge carriers from the channel to a respective contact area of the drain and source regions at a relatively low level, while also the parasitic drain/source capacitance and the electric field are to be taken into consideration. The requirement for shallow junctions having a relatively high conductivity while providing adequate channel control is commonly met by performing an ion implantation sequence on the basis of a spacer structure so as to obtain a high dopant concentration having a profile that varies laterally and in depth. The introduction of a high dose of dopants into a crystalline substrate area, however, generates heavy damage in the crystal structure, and, therefore, one or more anneal cycles are typically required for activating the dopants, i.e., for placing the dopants at crystal sites, and to cure the heavy crystal damage. However, the electrically effective dopant concentration is limited by the ability of the anneal cycles to electrically activate the dopants. This ability in turn is limited by the solid solubility of the dopants in the silicon crystal and the temperature and duration of the anneal process that are compatible with the process requirements. Moreover, besides the dopant activation and the curing of crystal damage, dopant diffusion may also occur during the annealing, which may lead to a "blurring" of the dopant profile. This effect may be advantageous in some cases for defining critical transistor properties, such as the overlap between the extension regions and the gate electrode, and also for reducing the overall capacitance of the PN junctions by increasing the depth of the deep drain and source areas, for instance, in silicon-on-insulator (SOI) devices, the drain and source areas may extend down to the buried insulating layer with a desired high concentration. Therefore, for highly advanced transistors, the positioning, shaping and maintaining of a desired dopant profile are important properties for defining the final performance of the device, since the overall series resistance of the conductive path between the drain and source contacts, as well as the controllability of the channel region, may represent a dominant aspect for determining the transistor performance.

Moreover, other important transistor characteristics may presently also be adjusted on the basis of the complex dopant profile in the active regions of the transistor elements. For example, the threshold voltage of a transistor, i.e., the voltage applied between the gate electrode and the source terminal of the transistor element, at which a conductive channel forms in the channel region, is a transistor characteristic that substantially affects overall transistor performance. Typically, the ongoing shrinkage of critical dimensions of the transistors may also be associated with a continuous reduction of the supply voltage of electronic circuitry. Consequently, for performance driven transistor elements, the corresponding threshold voltage may also have to be reduced in order to obtain a desired high saturation current at a reduced gate voltage, since the reduced supply voltage may also restrict the available voltage swing for controlling the channel of the transistor. However, the reduction of the threshold voltage, which may typically be accomplished by appropriately doping the well region of the transistor in combination with sophisticated halo implantation processes, which are designed so as to provide the appropriate dopant gradient at the PN junctions and for the overall conductivity of the channel region, may also affect the static leakage currents of the transistors. That is, by lowering the threshold voltage, typically the off current of the transistors may increase, thereby contributing to the overall power consumption of an integrated circuit, which may comprise millions of corresponding transistor elements. In addition to increased leakage currents caused by extremely thin gate dielectric materials, the static power consumption may result in unacceptable high power consumption, which may not be compatible with the heat dissipation capabilities of integrated circuits designed for general purposes. In an attempt to maintain the overall static leakage currents at an acceptable level, complex circuitries are typically designed so as to identify speed critical paths and selectively form transistors of the speed critical paths so as to have a low threshold voltage, while less critical signal paths may be realized on the basis of transistors of higher threshold voltages, thereby reducing static leakage currents while, however, also reducing switching speed of these transistors. For example, in modern central processing units (CPU), several different "flavors" of transistors may be employed in order to take into consideration the different hierarchy with respect to signal processing speeds.

For example, generally, high performance transistors, i.e., transistors having a very thin gate dielectric material, may, thus, be implemented with different transistor characteristics depending on the overall circuit layout and design. For instance, the different transistor characteristics may result in devices differing in gate leakage, off-current, threshold voltage and the like. Typically, these different characteristics may be implemented on the basis of an appropriate implantation regime when incorporating the well dopant species prior to patterning the gate electrode structures. Hence, the well dopant implantation sequence for N-channel transistors and P-channel transistors may be performed such that a well implantation may provide a basic well dopant concentration, which may be considered as a regular well dopant profile, while any other "flavors" may then be established by performing any further well implantation processes based on the same or a counter doping species, thereby increasing or reducing the overall conductivity in the corresponding well regions.

As discussed above, upon further scaling the overall transistor dimensions, short channel effects are frequently taken into consideration by additionally modifying the basic well dopant concentration in order to appropriately adjust the resulting threshold voltage of these short channel transistors. To this end, at an appropriate manufacturing stage, the maximum well dopant concentration may be locally increased by performing appropriate implantation processes so that a dopant species is incorporated that is counter-doping relative to the drain and source dopant species that are incorporated in the drain and source areas. Frequently, the corresponding implantation sequence is applied after patterning the gate electrode structures in order to obtain the locally increased well dopant concentration in a self-aligned manner with respect to the gate electrode structure. Also, in this manufacturing phase, the drain and source extension regions are typically implanted by using the gate electrode structures as an implantation mask in combination with appropriately configured offset spacer elements. Consequently, a moderately complex implantation sequence is required in this manufacturing phase, since, for instance, typically the locally increased dopant concentration, which is also referred to as a halo implantation, may have to be performed on the basis of a tilt angle, typically from two opposite sides of the transistor device. Furthermore, since the threshold voltage adjustment may have to be performed differently for the various transistors, correspondingly adapted halo implantation sequences may have to be applied.

Moreover, the continuous reduction of the channel length of sophisticated transistors may also require additional measures since, as discussed above, the static and dynamic leakage currents may exponentially increase, thereby failing to meet the thermal design power requirements of many circuits. For example, upon further reducing the channel length, typically an increased capacitive coupling of the gate electrode to the channel region is required, thereby necessitating an adaptation of a thickness of the gate dielectric material and/or the dielectric characteristics thereof. In most recent developments, a further reduction of the thickness of well-established gate dielectric materials, such as silicon oxynitride and the like, which may be provided with a thickness of 1.5 nm, may no longer be compatible with static power consumption requirements, so that a gate dielectric material may at least partially be provided in the form of a so-called high-k dielectric material, which is to be understood as a dielectric material having a dielectric constant of 10.0 or higher. For example, a plurality of metal oxide-based materials and silicates, for instance hafnium oxide, hafnium silicon oxide and the like, may frequently be used as a replacement material or in combination with a conventional very thin silicon oxide-based material, thereby providing the required capacitive coupling, while at the same time keeping the leakage currents at an acceptable level. Furthermore, these high-k dielectric materials may have to be provided in combination with appropriate metal-containing electrode materials since typically highly doped polysilicon may no longer have an appropriate work function so as to obtain the desired threshold voltage for N-channel transistors and P-channel transistors, respectively. To this end, appropriate metal species, such as titanium, tantalum, lanthanum, aluminum and the like, may be formed on or above the high-k dielectric material in order to obtain the desired electronic characteristics and also provide superior conductivity of the gate electrode material, at least in the vicinity of the gate dielectric material, thereby additionally avoiding the presence of a depletion zone, which may typically build up in a polysilicon-based electrode material in complex gate electrode structures.

In some sophisticated approaches, the high-k dielectric material in combination with an appropriate work function electrode material may be provided in an early manufacturing stage, i.e., upon patterning the gate electrode structure, thereby avoiding complex patterning and etch sequences in a late manufacturing stage, i.e., so-called replacement gate approaches in which the high-k dielectric material or at least the work function adjustment may be accomplished after completing the basic transistor configuration and after any high temperature processes.

It turns out, however, that the threshold voltage adjustment in an early manufacturing stage may require the incorporation of an appropriate channel material in some types of transistors in order to achieve a desired band gap offset, for instance with respect to P-channel transistors and N-channel transistors. To this end, in sophisticated approaches, an appropriate semiconductor alloy, such as a silicon/germanium alloy, is formed in or on the active region of one type of transistor, while other active regions are masked by an appropriate hard mask material. In this manner, an appropriate composition and thickness of the threshold voltage adjusting semiconductor alloy may be obtained, for instance, for P-channel transistors, thereby enabling a process strategy in which sophisticated high-k metal gate electrode structures may be formed so as to include the high-k dielectric material, the work function metal species and any metal-containing electrode materials, without requiring any modifications of the gate electrode structures in a later manufacturing stage. Consequently, in conventional sophisticated patterning strategies, the active regions of P-channel transistors receive the silicon/germanium alloy, while a required further adaptation of the threshold voltages of, for instance, transistors of extremely short channel, which is to be understood as a channel length of 50 nm and less, and transistors having a longer channel, that is, a channel length of above 50 nm, may be accomplished by applying additional implantation processes in a self-aligned manner, i.e., after the patterning of the gate electrode structures. For example, as explained above, corresponding halo implantation sequences may be applied so as to locally increase the basic well dopant concentration in order to appropriately adjust the threshold voltages of short channel transistors and "long" channel transistors. On the other hand, the incorporation of an additional well dopant species may, however, significantly affect the overall transistor performance, since the additional well dopant species may also be incorporated in drain and source areas, thereby reducing the effective degree of doping therein, which may have a particular influence on the short channel transistors, since frequently any reduction of the overall transistor dimensions may also require a reduction of the dopant concentration in the drain and source areas. Hence, the overall conductivity of the short channel transistors may be significantly influenced by the incorporation of halo regions which, in turn, are required in conventional strategies in order to obtain the desired threshold voltage in combination with the previously provided silicon/germanium alloy and the sophisticated high-k metal gate electrode structure.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides manufacturing techniques and semiconductor devices in which the threshold voltage of transistors of the same conductivity type with different channel lengths may be accomplished by selectively providing a threshold voltage adjusting semiconductor alloy without requiring any additional halo implantation process, thereby enhancing overall transistor performance and also providing a highly efficient overall manufacturing process flow. According to the principles disclosed herein, it has been recognized that providing a semiconductor alloy for adjusting the threshold voltage may result in an appropriate threshold voltage for transistors having a relatively long channel, while on the other hand, any short channel transistors, i.e., transistors having a gate length of 50 nm and less, may have a threshold voltage that may be adjusted on the basis of an early well doping in combination with the electronic characteristics of a sophisticated high-k metal gate electrode structure. Consequently, in some illustrative embodiments disclosed herein, the selective epitaxial growth process for forming the semiconductor alloy for, for instance, P-channel transistors may be performed on the basis of a masking regime in which the active regions or semiconductor regions of short channel transistors may be masked with a hard mask material, for instance together with any N-channel transistors, while the active regions of transistors having a longer channel may receive an appropriately adapted semiconductor alloy, such as a silicon/germanium alloy having an appropriate composition and thickness. Consequently, the processing may be continued by forming respective high-k metal gate electrode structures, wherein any subsequent sophisticated halo implantation processes may be omitted for at least the transistors of one conductivity type, thereby significantly enhancing efficiency of the overall process flow, that is, superior cycle times may be achieved since respective masking and implantation processes may be omitted.

One illustrative method disclosed herein comprises forming a threshold voltage adjusting semiconductor alloy on a first semiconductor region while masking a second semiconductor region. Moreover, the method comprises forming a first gate electrode structure of a first transistor above the first semiconductor region that includes the threshold voltage adjusting semiconductor alloy. Furthermore, the method comprises forming a second gate electrode structure of a second transistor on the second semiconductor region, wherein the first and second gate electrode structures comprise a high-k dielectric material. The method additionally comprises forming first drain and source regions in the first semiconductor region and forming second drain and source regions in the second semiconductor region, wherein the first and second drain and source regions have the same conductivity type.

A further illustrative method disclosed herein comprises adjusting a first well dopant concentration in a first semiconductor region and a second well dopant concentration in a second semiconductor region, wherein the first and second semiconductor regions have the same conductivity type. The method further comprises providing a threshold voltage adjusting semiconductor alloy selectively in the first semiconductor region. Moreover, the method comprises forming a first gate electrode structure above a first semiconductor region and a second gate electrode structure above a second semiconductor region of a semiconductor device, wherein the first and second gate electrode structures have a different gate length. Additionally, the method comprises forming first drain and source regions in the first semiconductor region and forming second drain and source regions in the second semiconductor region without increasing the first and second well dopant concentrations.

One illustrative semiconductor device disclosed herein comprises a first gate electrode structure of a first transistor formed on a threshold voltage adjusting semiconductor alloy of a first semiconductor region, wherein the first gate electrode structure has a first length. Furthermore, the device comprises a second gate electrode structure of a second transistor formed on a base material of a second semiconductor region, wherein the second gate electrode structure has a second length that is less than the first length. Furthermore, the semiconductor device comprises first drain and source regions formed in the first semiconductor region and second drain and source regions formed in the second semiconductor region, wherein the first and second drain and source regions have the same conductivity type.

BRIEF DESCRIPTION OF THE DRAWINGS

The disclosure may be understood by reference to the following description taken in conjunction with the accompanying drawings, in which like reference numerals identify like elements, and in which:

FIGS. 1b and 1c schematically illustrate cross-sectional views of the semiconductor device when forming a threshold voltage adjusting semiconductor alloy on the active region of "long channel" transistors, while masking the active regions of "short channel" transistors of the same conductivity type and also masking the active regions of transistors of inverse conductivity type, according to illustrative embodiments; and FIG. 1d schematically illustrates a cross-sectional view of the semiconductor device in a further advanced manufacturing stage in which sophisticated high-k metal gate electrode structures may be formed above the corresponding active regions, wherein gate electrode structures or transistors of the same conductivity type may be formed on active regions with a threshold voltage adjusting semiconductor alloy and without such a semiconductor alloy, according to further illustrative embodiments.

Figure 1A:
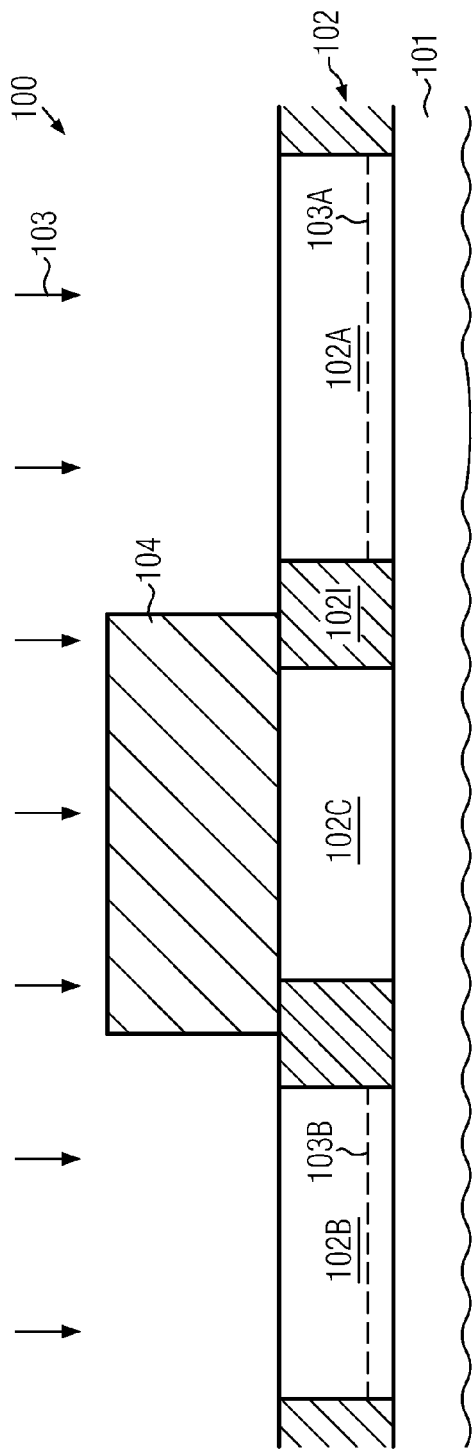
FIG. 1a schematically illustrates a cross-sectional view of a semiconductor device in which a basic well dopant concentration may be established in various active regions or semiconductor regions, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides manufacturing techniques and semiconductor devices in which sophisticated high-k metal gate electrode structures may be formed in an early manufacturing stage, thereby enabling the adjustment of appropriate threshold voltage values for P-channel transistors and N-channel transistors, respectively. Moreover, different threshold voltage values may be adjusted for transistors of the same conductivity type, for instance for P-channel transistors, in that a threshold adjusting semiconductor alloy may be formed selectively on a subset of the active regions of the P-channel transistors, for instance in active regions receiving transistors of longer channel lengths, while the transistors of short channel length may be formed without the semiconductor alloy. In some illustrative embodiments disclosed herein, a further adjustment of the threshold voltages, for instance based on conventionally applied halo implantation sequences, may not be required so that any degradation in transistor performance, that is typically associated with the incorporation of a counter-doping species in the drain and source areas, may be avoided. Furthermore, since corresponding complex halo implantation processes may be omitted for one type of transistor, such as P-channel transistors, a significant increase in overall throughput may be achieved since generally the cycle times of complex semiconductor devices comprising P-channel transistors and N-channel transistors with sophisticated high-k metal gate electrode structures may be enhanced.

FIG. 1a schematically illustrates a cross-sectional view of a semiconductor device 100 in an early manufacturing stage. As shown, the device 100 may comprise a substrate 101, such as a semiconductor substrate or any other appropriate carrier material which is appropriate for providing thereon or thereabove a semiconductor layer 102, such as a silicon layer, a silicon/germanium layer and the like. It should be appreciated that, in some illustrative embodiments, a buried insulating material layer (not shown) may be positioned below the semiconductor layer 102, thereby "vertically" isolating the semiconductor layer 102. In other cases, the semiconductor layer 102 may directly connect to a crystalline material of the substrate 101, thereby forming a bulk architecture. Furthermore, in the manufacturing stage shown, the semiconductor layer 102 may comprise a plurality of active regions or semiconductor regions, which are to be understood as laterally delineated semiconductor areas, in and above which at least one transistor element is to be formed. For example, the active regions may be appropriately laterally delineated by respective isolation regions 102I, which may be provided in the form of shallow trench isolations and the like. In the embodiment shown, a first active region 102A may be provided so as to receive a transistor having a moderately "long" gate length, i.e., a gate length of 50 nm and more, such as 100 nm, while at the same time a moderately low threshold voltage may be required for the corresponding transistor. To this end, an appropriate well dopant concentration may be established in the active region 102A so as to correspond to the conductivity type of the transistor still to be formed. As indicated, a well dopant concentration 103A having the appropriate conductivity type may be formed in the active region 102A, which in some illustrative embodiments may correspond to the semiconductor region of a P-channel transistor. Similarly, a second active region 102B may represent an active region of a "short channel" transistor, i.e., of a transistor having a gate length of 50 nm and less, wherein the active region 102B may be of the same conductivity type as the active region 102A. Consequently, a basic well dopant concentration 103B may be established therein so as to correspond to the desired conductivity type. It should be appreciated that the well dopant profiles or concentrations 103A, 103B may not necessarily be the same, depending on the overall process and device requirements. Moreover, a third active region 102C may be provided and may correspond to a transistor of inverse conductivity type with respect to the corresponding transistors to be formed in and above the active regions 102A, 102B. In the embodiment shown, the active region 102C may correspond to an N-channel transistor, which may be provided in the form of a short channel transistor. Moreover, an implantation mask 104 may be provided so as to cover the active region 102C while exposing the active regions 102A, 102B to an implantation process 103, in which a well dopant species may be incorporated in order to establish or modify the well dopant concentrations and profiles 103A, 103B.

The semiconductor device 100 as illustrated in FIG. 1a may be formed on the basis of the following process techniques. The isolation structures 102I may be formed by applying sophisticated lithography, deposition, etch, planarization and anneal techniques in order to form appropriate trenches in the semiconductor layer 102, and refilling the trenches with an appropriate dielectric material, such as silicon dioxide, silicon nitride and the like. Thereafter, any excess material may be removed in order to planarize the surface topography. Thereafter, the mask 104 may be provided on the basis of lithography techniques and the implantation process 103 may be performed so as to incorporate the desired well dopant species into the active regions 102A, 102B. Prior to or after the implantation process 103, an appropriate well dopant species may be incorporated into the active region 102C in order to establish the desired basic well dopant concentration therein. It should be appreciated that also additional implantation processes may be performed so as to position specific dopant species at an appropriate height level, for instance in view of adjusting the overall channel conductivity, the threshold voltage values and the like. In other illustrative embodiments, at least some of the implantation processes for incorporating the basic well dopant species may be performed prior to forming the isolation structures 102I, if considered appropriate for the further processing of the device 100.

Figure 1B:
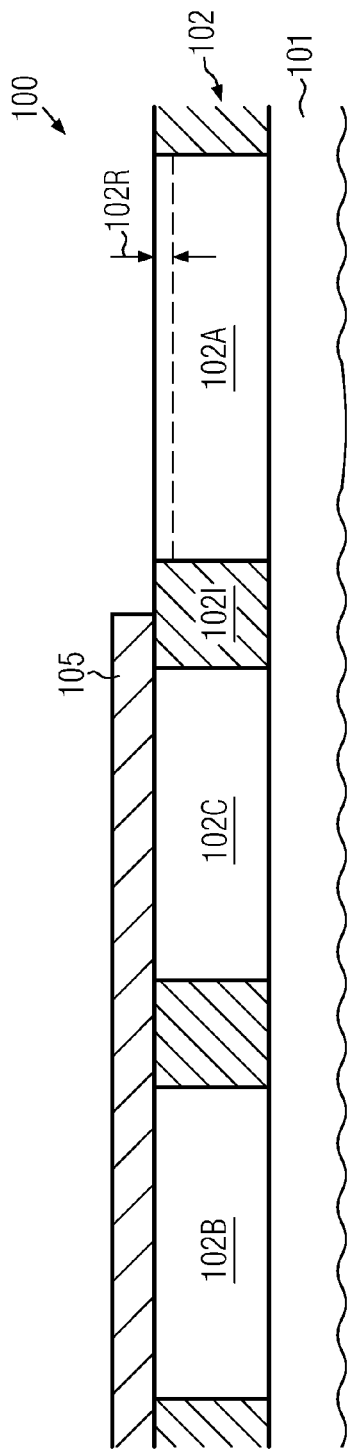

FIG. 1b schematically illustrates the semiconductor device 100 in a further advanced manufacturing stage. As shown, a hard mask 105 may be formed so as to cover the active regions 102B, 102C while exposing the active region 102A. The hard mask 105 may be comprised of silicon dioxide, silicon nitride, a combination thereof and the like. To this end, the mask material may be formed by deposition and/or oxidation, depending on the overall process technique. Thereafter, if required, a recess 102R may be provided in the active region 102A in order to refill the recess 102R with a threshold voltage adjusting semiconductor alloy, which may be advantageous in view of the finally obtained surface topography. In other cases, a corresponding semiconductor alloy may be formed directly on the active region 102A.

FIG. 1c schematically illustrates the semiconductor device 100 in a further advanced manufacturing stage. As illustrated, a threshold voltage adjusting semiconductor alloy 106 may be formed on the active region 102A and may thus represent a portion thereof. In some illustrative embodiments, the material 106 may be a silicon/germanium alloy with an appropriate material composition and thickness so as to obtain a desired threshold voltage for a long channel transistor to be formed in and above the active region 102A. As previously explained, in combination with sophisticated high-k metal gate electrode structures, the resulting threshold voltage may be efficiently adjusted by forming an appropriate interface layer, which may directly connect to the gate dielectric material, followed by the corresponding electrode material, so that the band gap configuration of the layer 106 may significantly influence the finally obtained threshold voltage. To this end, any appropriate concentration profile in the layer 106 may be implemented in combination with a desired thickness for a given configuration of the high-k metal gate electrode structure still to be formed. For example, a silicon/germanium alloy with a germanium concentration of up to 30 atomic percent and with a layer thickness of approximately 5-50 nm may be used, depending on the desired threshold voltage. To this end, well-established selective epitaxial growth techniques may be applied in which process parameters, such as temperature and pressure, are selected such that the alloy material may preferably adhere to the exposed silicon base material of the active region 102A, while significant material deposition on dielectric surface areas, such as the isolation regions 102I and the hard mask 105, may be suppressed. After the deposition of the material 106, the hard mask 105 may be removed, for instance on the basis of well-established wet chemical etch recipes, plasma assisted etch recipes and the like. Hence, upon exposing the active regions 102B, 102C, the further processing may be continued by depositing an appropriate material system for forming a sophisticated high-k metal gate electrode structure on the active regions 102A, 102B, 102C.

FIG. 1d schematically illustrates the semiconductor device 100 in a further advanced manufacturing stage. As illustrated, a first transistor 150A may be formed in and above the active region 102A and may comprise a gate electrode structure 160A having a gate length 166A, which may be considered as a "long channel" length and may be 50 nm and significantly greater. The gate electrode structure 160A may be formed on the previously deposited semiconductor alloy 106 and may comprise a high-k dielectric material 162A in combination with a metal-containing electrode material 163A. Moreover, as previously discussed, in some illustrative embodiments, an additional conventional gate dielectric material 161 may be positioned below the high-k dielectric material 162A in order to provide superior interface characteristics. For example, a very thin silicon oxynitride layer may be provided with a thickness of approximately 1 nm and less. Furthermore, a semiconductor-based electrode material 164, such as a polycrystalline silicon, a silicon/germanium material and the like, may be formed above the metal-containing electrode material 163A. Additionally, a sidewall spacer structure 165 may be provided in the gate electrode structure 160A. Moreover, drain and source regions 151A may be formed in the active region 102A and may have any appropriate lateral and vertical dopant profile so as to comply with the overall requirements for the transistor 150A.

Similarly, a second transistor 150B of the same conductivity type as the transistor 150A may be formed in and above the active region 102B and may comprise a gate electrode structure 160B, which may have basically the same configuration as the structure 160A, except for a significantly reduced gate length 166B, which may be 50 nm and less. Thus, a conventional thin dielectric material 161 may be provided in combination with the high-k dielectric material 162A and the metal-containing electrode material 163A. Similarly, drain and source regions 151B may be formed in the active region 102B.

It should be appreciated that, in some illustrative embodiments, the basic well dopant concentration 103B may still be preserved in the active region 102B outside of the drain and source regions 151B, since during the preceding processing any additional implantation processes for locally increasing the well dopant concentration, for instance in the form of halo regions, may be omitted. Similarly, in some illustrative embodiments, also the previously established basic well dopant concentration 103A in the active region 102A may have been preserved during the preceding processing by omitting any specific halo implantation processes.

Moreover, a third transistor 150C may be provided in and above the active region 102C and may represent a transistor of inverse conductivity type with respect to the transistors 150A, 150B. In the embodiment shown, the transistor 150C may thus represent an N-channel transistor having a gate electrode structure 160C, for instance with a gate length of 50 nm and less, which may be formed directly on the base material of the active region 102C. Moreover, the gate dielectric material 161 may be provided, followed by a high-k dielectric material 162C and a metal-containing electrode material 163C. The further components, such as the semiconductor-based electrode material 164 and the spacer structure 165 may be of similar configuration as in the gate electrode structures 160A, 160B. Moreover, respective drain and source regions 151C having a desired lateral and vertical dopant profile may be formed in the active region 102C, wherein an additional implantation region 152 may be provided so as to adjust the desired threshold voltage characteristics of the transistor 150C. That is, during the preceding processing, the initially provided well dopant concentration may be locally increased, thereby forming the regions 152, which may also be referred to as halo regions and which are generally of inverse conductivity type compared to the drain and source regions 151C. Consequently, in the embodiments shown, the drain and source regions 151A, 151B of the transistors 150A, 150B may be formed on the basis of any appropriate process technique, such as implantation processes, without requiring any additional local increase of the initially established well dopant concentrations 103A, 103B, respectively, thereby significantly reducing the overall complexity of the corresponding manufacturing process. On the other hand, the final transistor characteristics of the device 150C may be efficiently established by incorporating the halo regions 152 in the active region 102C at any appropriate manufacturing stage, i.e., after forming the gate electrode structure 160C.

The semiconductor device 100 as shown in FIG. 1d may be formed on the basis of the following process strategy. After forming the threshold voltage adjusting semiconductor alloy 106 selectively in the active region 102A, appropriate material systems may be formed, for instance by oxidation and deposition, in order to provide the layer 161 in combination with a high-k dielectric material layer, such as a hafnium oxide layer and the like. To this end, well-established process techniques may be applied. Thereafter, appropriate metal-containing material, such as titanium nitride and the like, may be deposited so as to include an appropriate work function metal species, such as lanthanum for the transistor 150C and aluminum for the transistors 150A, 150B, when representing P-channel transistors. In other cases, respective dedicated work function metal layers may be deposited and may be appropriately patterned so as to position the proper work function metal species above the corresponding active region. In some illustrative embodiments, additional heat treatments may be performed so as to initiate a diffusion of a work function metal species into the underlying high-k materials, thereby obtaining the high-k material 162A for the gate electrode structures 160A, 160B, while forming the high-k material 162C for the gate electrode structure 160C. Similarly, the metal-containing electrode materials 163A, 163C have different configurations, for instance in terms of any incorporated work function metal species. Thereafter, the semiconductor-based electrode material 164 may be deposited, possibly in combination with additional hard mask materials and the like. Next, sophisticated lithography and patterning strategies may be applied in order to provide the gate electrode structures 160B, 160C with a desired short gate length, while the gate electrode structure 160A may have the required greater gate length 166A. Next, corresponding implantation sequences and masking steps may be performed so as to provide the drain and source regions 151B, 151A on the one hand, and the drain and source regions of inverse conductivity type 151C in the active region 102C, which may be accomplished on the basis of appropriate implantation techniques. As previously discussed, in some illustrative embodiments, the drain and source regions 151B, 151A may be formed without any additional halo implantation processes, while in the active region 102C a corresponding halo implantation may be performed, for instance upon incorporating drain and source extension regions (not shown) in accordance with well-established process strategies. Thereafter, the spacer structures 165 may be completed and may then be used as further implantation masks for performing any further implantation processes in order to incorporate further drain and source dopant species as required. Finally, any high temperature anneal processes may be applied in order to activate the dopant species and re-crystallize implantation-induced damage. Moreover, if required, a certain dopant diffusion may be initiated in order to adjust the final vertical and lateral dopant profile.

As a result, the present disclosure provides manufacturing techniques and semiconductor devices in which the threshold voltage adjustment of sophisticated transistors of one conductivity type, such as P-channel transistors, may be accomplished selectively, providing a threshold voltage adjusting semiconductor alloy for "long channel" transistors, while the electronic characteristics of the high-k metal gate electrode structure may be appropriate to obtain a desired threshold voltage for short channel transistors without providing the semiconductor alloy. Similarly, the formation of the semiconductor alloy may be blocked in transistors of inverse conductivity type, such as N-channel transistors, wherein additionally the threshold voltage values may be tuned on the basis of additional halo implantation processes, which in some illustrative embodiments may be omitted for the P-channel transistors. In this manner, a transistor degradation, which may conventionally be associated with the incorporation of halo regions in P-channel transistors, may be avoided, while at the same time overall process efficiency may be increased by omitting the complex halo implantation process sequences for the P-channel transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    selectively forming a threshold voltage adjusting semiconductor alloy on a first semiconductor region while preventing said threshold adjusting semiconductor alloy from being formed on a second semiconductor region and a third semiconductor region;
    forming a first gate electrode structure of a first transistor above said first semiconductor region including said threshold voltage adjusting semiconductor alloy, said first gate electrode structure having a first gate length;
    forming a second gate electrode structure of a second transistor on said second semiconductor region, said second gate electrode structure having a second gate length that is less than said first gate length, the first and second gate electrode structures comprising a high-k dielectric material;
    forming first drain and source regions in said first semiconductor region;
    forming second drain and source regions in said second semiconductor region, said first and second drain and source regions having the same conductivity type; and
    forming third drain and source regions in said third semiconductor region, said third drain and source regions having an inverse conductivity type relative to said same conductivity type of said first and second transistors.

2. The method of claim 1, wherein said second gate length is approximately 50 nm or less.

3. The method of claim 1, further comprising performing a well implantation process sequence so as to adjust a well doping concentration of said first and second semiconductor regions prior to forming said first and second gate electrode structures.

4. The method of claim 1, further comprising forming a third gate electrode structure on said third semiconductor region and increasing a well dopant concentration selectively in said third active region after forming said third gate electrode structure.

5. The method of claim 1, wherein forming said first and second gate electrode structures comprises providing a work function metal species prior to forming a semiconductor containing electrode material above said high-k dielectric material.

6. The method of claim 1, wherein forming said threshold adjusting semiconductor alloy comprises forming a silicon and germanium containing semiconductor material.

7. The method of claim 6, wherein said first and second transistors are P-channel transistors.

8. The method of claim 1, wherein preventing said threshold adjusting semiconductor alloy from being formed above said second semiconductor region comprises masking said second semiconductor region.

9. A method, comprising:
adjusting a first well dopant concentration in a first semiconductor region and a second well dopant concentration in a second semiconductor region, said first and second semiconductor regions having the same conductivity type after adjusting said first and second well dopant concentrations;
adjusting a third well dopant concentration in a third semiconductor region, said third semiconductor region having an inverse conductivity type relative to said same conductivity type of said first and second semiconductor regions after adjusting said third well dopant concentration;
providing a threshold voltage adjusting semiconductor alloy selectively in said first semiconductor region;
forming a first gate electrode structure above said first semiconductor region and a second gate electrode structure above said second semiconductor region of a semiconductor device, said first and second gate electrode structures having a different gate length; and
forming first drain and source regions in said first semiconductor region and second drain and source regions in said second semiconductor region without increasing said first and second well dopant concentrations.

10. The method of claim 9, wherein providing said threshold adjusting semiconductor alloy comprises selectively growing a silicon/germanium alloy on said first active region while covering said second semiconductor region with a hard mask.

11. The method of claim 9, wherein said third well dopant concentration of said third semiconductor region is adjusted after forming a third gate electrode structure on said third semiconductor region.

12. The method of claim 11, wherein adjusting said third well dopant concentration of said third semiconductor region comprises forming halo regions in said third semiconductor region.

13. The method of claim 9, wherein providing said threshold voltage adjusting semiconductor alloy selectively in said first semiconductor region comprises forming a hard mask so as to cover said second and third semiconductor regions.

14. The method of claim 9, wherein a gate length of said first gate electrode structure is greater than a gate length of said second gate electrode structure.

15. The method of claim 14, wherein said second gate electrode structure is formed so as to have said gate length of approximately 50 nm or less.

16. The method of claim 9, wherein forming said first and second gate electrode structures comprises providing a high-k dielectric material.

17. A method, comprising:
forming a first PMOS transistor element in and above a first active region of a semiconductor device, said first PMOS transistor element comprising a first gate electrode structure having a first gate length;
forming a second PMOS transistor element in and above a second active region of said semiconductor device, said second PMOS transistor element comprising a second gate electrode having a second gate length that is less than said first gate length;
forming an NMOS transistor element in and above a third active region of said semiconductor device;
selectively adjusting a threshold voltage of said NMOS transistor element by selectively performing a halo implantation process in said third active region; and
selectively adjusting a threshold voltage of said first and second PMOS transistor elements without performing a halo implantation process in said first and second active regions.

18. The method of claim 17, wherein selectively adjusting said threshold voltage of said first PMOS transistor element comprises selectively forming a threshold adjusting semiconductor alloy in said first active region prior to forming said first gate electrode structure.

19. The method of claim 18, wherein said threshold voltage of said second PMOS transistor element is selectively adjusted without forming a threshold adjusting semiconductor alloy in said second active region.

* * * * *